United States Patent
Hsu

(10) Patent No.: US 9,337,802 B2
(45) Date of Patent: May 10, 2016

(54) RESONATOR FILTER HAVING A RECESS IN INSULATING MATERIAL OF A MULTI-LAYERED COUPLING STRUCTURE

(71) Applicant: UNITED MICROELECTRONICS CORP., Hsin-Chu (TW)

(72) Inventor: Ming-Shun Hsu, Miaoli County (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 222 days.

(21) Appl. No.: 14/201,914

(22) Filed: Mar. 9, 2014

(65) Prior Publication Data

US 2015/0256146 A1 Sep. 10, 2015

(51) Int. Cl.
 *H03H 9/54* (2006.01)
 *H03H 9/205* (2006.01)
 *H03H 9/58* (2006.01)

(52) U.S. Cl.
 CPC .............. *H03H 9/205* (2013.01); *H03H 9/584* (2013.01); *H03H 9/585* (2013.01); *H03H 9/589* (2013.01)

(58) Field of Classification Search
 CPC ....... H03H 9/0095; H03H 9/175; H03H 9/54; H03H 9/583; H03H 9/584; H03H 9/585; H03H 9/589; H03H 9/205
 USPC ............................................................ 333/189
 See application file for complete search history.

(56) References Cited

U.S. PATENT DOCUMENTS

| 6,720,844 | B1* | 4/2004 | Lakin | H03H 9/0095 310/328 |
| 6,917,261 | B2* | 7/2005 | Unterberger | H03H 9/0095 310/322 |
| 6,963,257 | B2* | 11/2005 | Ella | H03H 7/42 310/335 |
| 7,479,851 | B2 | 1/2009 | Aigner et al. | |
| 7,719,388 | B2* | 5/2010 | Schmidhammer | H03H 9/0207 333/187 |
| 7,786,825 | B2* | 8/2010 | Handtmann | H03H 9/0095 333/189 |
| 7,825,749 | B2* | 11/2010 | Thalhammer | H03H 3/04 333/133 |
| 8,198,958 | B1* | 6/2012 | Aigner | H03H 9/542 310/322 |

\* cited by examiner

*Primary Examiner* — Barbara Summons
(74) *Attorney, Agent, or Firm* — Winston Hsu; Scott Margo

(57) ABSTRACT

A resonator filter includes a substrate, a bottom electrode formed on the substrate, a multi-layered coupling structure formed on the bottom electrode, a top electrode formed on the multi-layered coupling structure, a first piezoelectric layer sandwiched in between the bottom electrode and the multi-layered coupling structure, and a second piezoelectric layer sandwiched in between the multi-layered coupling structure and the top electrode. The multi-layered coupling structure includes at least an insulating material.

13 Claims, 1 Drawing Sheet

RESONATOR FILTER HAVING A RECESS IN INSULATING MATERIAL OF A MULTI-LAYERED COUPLING STRUCTURE

BACKGROUND OF THE INVENTION

1. Field of the Invention

The invention relates to a resonator filter, and more particularly, to a resonator filter in a stacked crystal filter (hereinafter abbreviated as SCF) arrangement.

2. Description of the Prior Art

In recent years, piezoelectric thin film process is prevalently employed for forming filters and duplexer used in radio frequency (RF) communication systems. The conventional piezoelectric thin film acoustic component can be classified as a thin film bulk acoustic resonator (FBAR) and a solidly mounted resonator (SMR).

A resonator filter in SCF arrangement conventionally includes a top electrode, a middle electrode, a bottom electrode, an upper piezoelectric layer sandwiched in between the top and middle electrodes, and a lower piezoelectric layer sandwiched in between the middle and bottom electrodes. For example, when the top electrode serves as the input electrode, the middle electrode serves as the ground electrode, and the bottom electrode serves as the output electrode, the input electrode receives a signal from an input terminal, and the upper piezoelectric layer then generates a bulk acoustic wave to the lower piezoelectric layer in response to the signal excitation. A resonance is therefore generated between the input electrode and the output electrode, and the output electrode outputs the signal to an output terminal.

For such as a RF filter, insertion loss and bandwidth are the key factors to judge filter performance. Therefore, it is always in need to reduce insertion loss and increase bandwidth.

SUMMARY OF THE INVENTION

According to an aspect of the present invention, a resonator filter is provided. The resonator includes a substrate, a bottom electrode formed on the substrate, a multi-layered coupling structure formed on the bottom electrode, a top electrode formed on the multi-layered coupling structure, a first piezoelectric layer sandwiched in between the bottom electrode and the multi-layered coupling structure, and a second piezoelectric layer sandwiched in between the multi-layered coupling structure and the top electrode. The multi-layered coupling structure includes at least an insulating material.

According to the resonator filter provide by the present invention, the middle ground electrode conventionally formed in between the top electrode and the bottom electrode is replaced by the multi-layered coupling structure including the insulating material. Consequently, waves are confined in the transmission region by the multi-layered coupling structure, and thus insertion loss and transmission loss are efficaciously reduced while bandwidth is increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
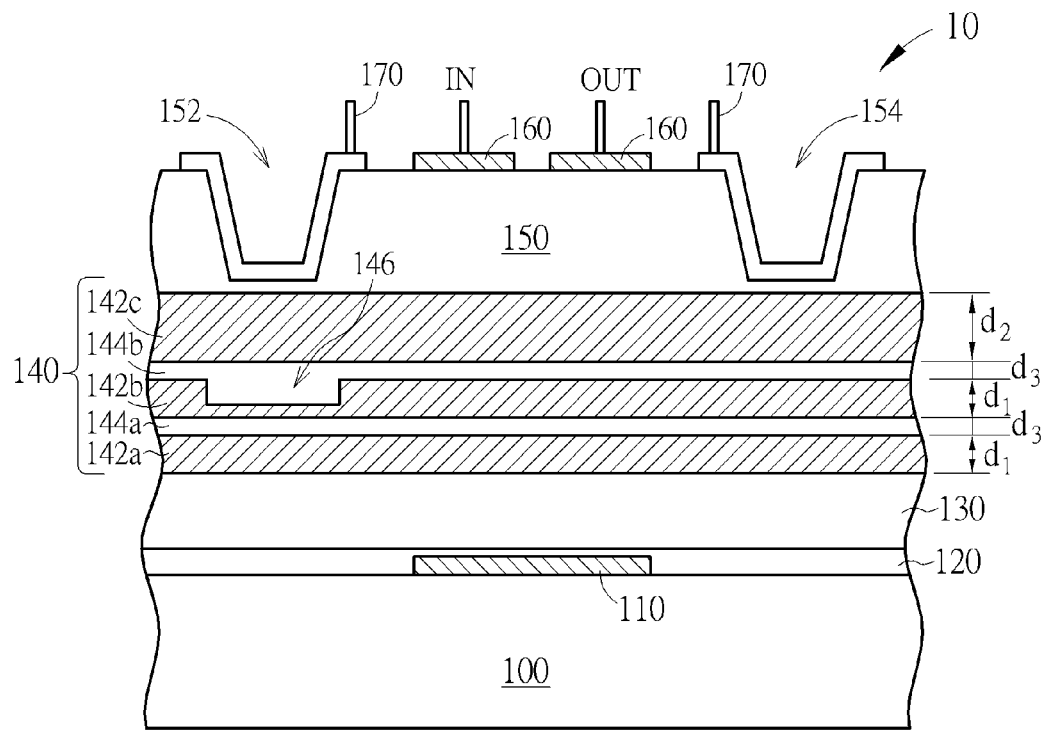
FIG. 1 is a schematic drawing illustrating a resonator filter provided by a first preferred embodiment of the present invention.

Please refer to FIG. 1, which is a schematic drawing illustrating a resonator filter provided by a first preferred embodiment of the present invention. As shown in FIG. 1, the resonator filter 10 provided by preferred embodiment includes a substrate 100, a bottom electrode 120 formed on the substrate 100, a multi-layered coupling structure 140 formed on the bottom electrode 120, a top electrode 160 formed on the multi-layered coupling structure 140. In other words, the multi-layered coupling structure 140 is arranged in between the bottom electrode 120 and the top electrode 160. More important, a first piezoelectric layer 130 is sandwiched in between the bottom electrode 120 and the multi-layered coupling structure 140, and a second piezoelectric layer 150 is sandwiched in between the multi-layered coupling structure 140 and the top electrode 160. More particularly, the multi-layered coupling structure 140 provided by preferred embodiment is sandwiched in between the first piezoelectric layer 130 and the second piezoelectric layer 150. In accordance with preferred embodiment, the top electrode 160 further includes an input terminal IN and an output terminal OUT. As shown in FIG. 1, the input terminal IN and the output terminal OUT are physically and electrically isolated from each other. Furthermore, a reflector 110 is formed in between the bottom electrode 120 and the substrate 100. The reflector 110 can include aluminum nitride (AlN), aluminum oxide ($Al_2O_3$), tungsten (W), or silicon oxide ($SiO_2$), but not limited to this.

The substrate 100 can be a silicon substrate or a gallium arsenide (GaAs), but not limited to this. The bottom electrode 120 and the top electrode 160 include any proper conductive material. The first piezoelectric layer 130 and the second piezoelectric layer 150 include zinc oxide (ZnO), aluminum nitride (AlN), zinc sulfide (ZnS) or any other piezo-electric material that can be fabricated as a thin film. As a further example, also ferroelectric ceramics can be used as the piezoelectric material. For example, plumbum titanate ($PbTiO_3$) or plumbum zirconate-titanate ($Pb(Zr_xTi_{1-x})O_3$) and other member of so called lead lanthanum zirconate titanate family can be used.

Please refer to FIG. 1 again. A first cavity 152 and a second cavity 154 are formed in the second piezoelectric layer 150, and the top electrode 160 (including the input terminal IN and the output terminal OUT) is arranged in between the first cavity 152 and the second cavity 154. The first cavity 152 and the second cavity 154 are spaced apart from each other by the second piezoelectric layer 150 while the second piezoelectric layer 150 is exposed at a bottom of the first cavity 152 and a bottom of the second cavity 154, respectively, as shown in FIG. 1. More important, the resonator filter 10 provided by the preferred embodiment further includes a ground terminal 170 formed in the first cavity 152 and the second cavity 154, respectively. It is noteworthy that a size of the reflector 110 can be defined by a distance between the first cavity 152 and the second cavity 154 according to the preferred embodiment.

Please still refer to FIG. 1. The multi-layered coupling structure 140 sandwiched in between the first piezoelectric layer 130 and the second piezoelectric layer 150 includes at least an insulating material. According to the preferred embodiment, the multi-layered coupling structure 140 upwardly and sequentially includes at least a first low-impedance layer 142a, a second low-impedance layer 142b, and a third low-impedance layer 142c. A first high-impedance layer 144a is sandwiched in between the first low-impedance layer 142a and the second low-impedance layer 142b, and a second high-impedance layer 144b is sandwiched in between the second low-impedance layer 142b and the third low-impedance layer 142c. At least one of the first low-impedance layer 142a, the second low-impedance layer 142b, and the third low-impedance layer 142c includes the insulating material. In the preferred embodiment, the first low-impedance layer 142a, the second low-impedance layer 142b and the third low-impedance layer 142c all include the insulating material. For example, the first low-impedance layer 142c, the second low-impedance layer 142b and the third low-impedance layer 142c can include silicon oxide, but not limited to this. The first high-impedance layer 144a and the second high-impedance layer 144b can include amorphous silicon, platinum (Pt), molybdenum (Mo), or tantalum pentoxide ($Ta_2O_5$), but not limited to this.

Furthermore, the first low-impedance layer 142a and the second low-impedance layer 142b include a thickness $d_1$, the third low-impedance layer 142c include a thickness $d_2$, and the first high-impedance layer 144a and the second high-impedance layer 144b include a thickness $d_3$. It is noteworthy that the thickness $d_1$ of the first low-impedance layer 142a and the second low-impedance layer 142b is a half of the thickness $d_2$ of the third low-impedance layer 142c. For example, when the first low-impedance layer 142a, the second low-impedance layer 142b, and the third low-impedance layer 142c include silicon oxide ($SiO_x$), of which a refractive index is 1.45, and the first high-impedance layer 144a and the second high-impedance layer 144b include amorphous silicon, of which a refractive index is 3.7, the thickness $d_1$ of the first low-impedance layer 142a and the second low-impedance layer 142b is about 1 micrometer (μm), the thickness $d_2$ of the third low-impedance layer 142c is about 2 μm, and thickness $d_3$ of the first high-impedance layer 144a and the second high-impedance layer 144b is about 0.12 μm, but not limited to this.

Please still refer to FIG. 1. The resonator filter 10 provided by the preferred embodiment further includes a first recess 146 formed in the insulating material of the multi-layered coupling structure 140. Particularly, the first recess 146 is formed in the first low-impedance layer 142a or the second low-impedance layer 142b. As shown in FIG. 1, the first recess 146 is preferably formed in the second low-impedance layer 142b and is filled up with the second high-impedance layer 144b. Additionally, the first recess 146 is preferably formed correspondingly to the first cavity 152 or the second cavity 154, as shown in FIG. 1. Because of the first recess 146, the multi-layered coupling structure 140 obtains an asymmetric configuration.

According to the resonator filter 10 provided by the preferred embodiment, the multi-layered coupling structure 140 including the insulating material is sandwiched in between the first piezoelectric layer 130 and the second piezoelectric layer 150. The multi-layered coupling structure 140 includes at least a low impedance material comprising the aforementioned insulating material and a high-impedance conductive material. It is observed that the waves are confined in transmission region by the multi-layered coupling structure 140. Secondly, transmission loss is reduced and distortion is alleviated by the first cavity 152 and the second cavity 154 formed in the second piezoelectric layer 150. Furthermore, the multi-layered coupling structure 140 obtains the asymmetric configuration due to the first recess 146, which is formed in the second low-impedance layer 142b of the multi-layered coupling structure 140 and correspondingly to the first cavity 152 or the second cavity 154. The asymmetric multi-layered coupling structure 140 improves coupling efficiency, and thus the resonator filter 10 of the preferred embodiment can be used in high bandwidth application.

Figure 2:
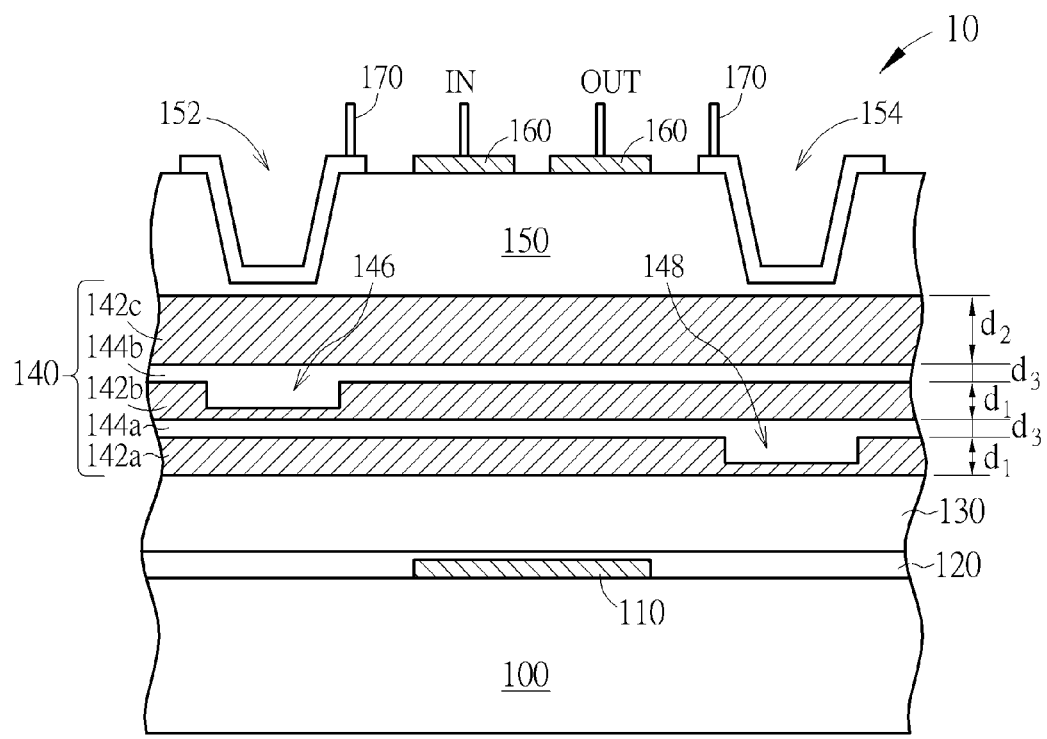
FIG. 2 is a schematic drawing illustrating a resonator filter provided by a second preferred embodiment of the present invention.

Please refer to FIG. 2, which is a schematic drawing illustrating a resonator filter provided by a second preferred embodiment of the present invention. It is noteworthy that elements the same in both of the first and second preferred embodiments are designated by the same numerals and material for forming elements the same in both of the first and second preferred embodiments can be identical. Therefore such details are omitted hereinafter in the interest of brevity. Furthermore, elements the same in the first and second preferred embodiments can be formed in identical arrangement, and thus those details are also omitted for simplicity. The difference between the first and second preferred embodiments is: the resonator filter 10 provided by the second preferred embodiment includes a first recess 146 and a second recess 148 formed in the insulating material of the multi-layered coupling structure 140. The first recess 146 is formed correspondingly to the first cavity 152, and the second recess 148 is formed correspondingly to the second cavity 154. It is noteworthy that though both of the first recess 146 and the second recess 148 are formed in the insulating material of the multi-layered coupling structure 140, the first recess 146 and the second recess 148 are formed in different low-impedance layers. As shown in FIG. 2, the first recess 146 is formed in the second low-impedance layer 142b and filled up with the second high-impedance layer 144b while the second recess 148 is formed in the first low-impedance layer 142a and filled up with the first high-impedance layer 144a according to the preferred embodiment. In other words, the first recess 146 and the second recess 148 are asymmetrically formed in the multi-layered coupling structure 140. Because the first recess 146 and the second recess 148 are formed in different low-impedance layers, the multi-layered coupling structure 140 of the preferred embodiment still obtains an asymmetric configuration.

Additionally, according to a modification to the preferred embodiment, the first recess 146 and the second recess 148 can be formed in the same low-impedance layer in the multi-layered coupling structure 140, but includes different depths. Therefore the multi-layered coupling structure 140 still obtains the asymmetric configuration. According to another modification to the preferred embodiment, the resonator filter 10 can include more than three recesses and those recesses can be asymmetrically formed in the same or different layers in the multi-layered coupling structure 140 as long as the multi-layered coupling structure 140 obtains the asymmetric configuration.

According to the resonator filter 10 provided by the preferred embodiment, the multi-layered coupling structure 140 including the insulating material is sandwiched in between the first piezoelectric layer 130 and the second piezoelectric layer 150. The multi-layered coupling structure 140 includes at least a low impedance material comprising the aforementioned insulating material and a high-impedance conductive material. It is observed that the waves are confined in the transmission region by the multi-layered coupling structure 140. Secondly, transmission loss is reduced and distortion is alleviated by the first cavity 152 and the second cavity 154 formed in the second piezoelectric layer 150. Furthermore, the multi-layered coupling structure 140 obtains the asymmetric configuration due to the first recess 146, which is formed in the second low-impedance layer 142b and correspondingly to the first cavity 152, and the second recess 148, which is formed in the first low-impedance layer 142a and correspondingly to the second cavity 154. The asymmetric multi-layered coupling structure 140 improves coupling efficiency, and thus the resonator filter 10 of the preferred embodiment can be used in high bandwidth application.

Please refer to Table 1, which summarizes the propagation loss of the resonator filter 10 provided by the first and the second preferred embodiments in three transverse electric modes (TE):

TABLE 1

|  | $TE_0$ | $TE_1$ | $TE_2$ |
|---|---|---|---|
| One recess | 10.7 | 821 | 994 |
| Two recesses | 0.11 | 234 | 122 |

Unit: dB/cm

According to Table 1, it is observed that when the resonator filter includes two asymmetrically formed recesses, propagation loss of this resonator filter is reduced to be lower than one percent of the propagation loss of a resonator filer including only single one recess. In other words, the resonator filter including two asymmetrically formed recesses efficaciously reduces propagation loss and thus is more preferred in higher bandwidth application.

According to the resonator filter provide by the present invention, the middle ground electrode formed between the top electrode and the bottom electrode according to conventional SCF arrangement is replaced by the multi-layered coupling structure including the insulating material. The multi-layered coupling structure can include one recess, two recesses, or even more than three recesses asymmetrically formed in the insulating material. Consequently, waves are confined in the transmission region by the multi-layered coupling structure, and thus insertion loss and transmission loss are efficaciously reduced. Therefore the resonator filter provided by the present invention can be used in high bandwidth application when the requested bandwidth is higher than 2.5 GHz.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resonator filter, comprising:
    a substrate;
    a bottom electrode formed on the substrate;
    a multi-layered coupling structure formed on the bottom electrode, the multi-layered coupling structure comprising at least an insulating material;
    a first recess formed in the insulating material of the multi-layered coupling structure;
    a top electrode formed on the multi-layered coupling structure;
    a first piezoelectric layer sandwiched in between the bottom electrode and the multi-layered coupling structure; and
    a second piezoelectric layer sandwiched in between the multi-layered coupling structure and the top electrode.

2. The resonator filter according to claim 1, wherein the multi-layered coupling structure further comprises:
    at least a first low-impedance layer, a second low-impedance layer, and a third low-impedance layer; and
    a first high-impedance layer and a second high-impedance layer, the first high-impedance layer being sandwiched in between the first low-impedance layer and the second low-impedance layer and the second high-impedance layer being sandwiched in between the second low-impedance layer and the third low-impedance layer.

3. The resonator filter according to claim 2, wherein at least one of the first low-impedance layer, the second low-impedance layer, and the third low-impedance layer comprises the insulating material.

4. The resonator filter according to claim 3, wherein the first low-impedance layer, the second low-impedance layer, and the third low-impedance layer comprise silicon oxide.

5. The resonator filter according to claim 2, wherein the first high-impedance layer and the second high-impedance layer comprise amorphous silicon, platinum (Pt), molybdenum (Mo) or tantalum pentoxide ($Ta_2O_5$).

6. The resonator filter according to claim 2, wherein a thickness of the first low-impedance layer and a thickness of the second low-impedance layer are a half of a thickness of the third low-impedance layer, respectively.

7. The resonator filter according to claim 1, further comprising a first cavity and a second cavity formed in the second piezoelectric layer and spaced apart from each other by the second piezoelectric layer.

8. The resonator filter according to claim 7, wherein the second piezoelectric layer is exposed at a bottom of the first cavity and a bottom of the second cavity.

9. The resonator filter according to claim 7, further comprising a ground terminal formed in the first cavity and the second cavity, respectively.

10. The resonator filter according to claim 7, wherein the top electrode is formed in between the first cavity and the second cavity.

11. The resonator filter according to claim 1, further comprising a second recess formed in the insulating material of the multi-layered coupling structure, and the first recess and the second recess are asymmetrically formed.

12. The resonator filter according to claim 1, wherein the top electrode further comprises an input terminal and an output terminal.

13. The resonator filter according to claim 1, further comprising a reflector formed in between the bottom electrode and the substrate.

* * * * *